United States Patent
Huang et al.

(10) Patent No.: US 10,249,777 B2
(45) Date of Patent: Apr. 2, 2019

(54) INFRARED LIGHT EMITTING DIODE

(71) Applicant: XIAMEN SAN'AN OPTOELECTRONICS CO., LTD., Xiamen (CN)

(72) Inventors: Chun Kai Huang, Xiamen (CN); Chun-Yi Wu, Xiamen (CN); Duxiang Wang, Xiamen (CN); Chaoyu Wu, Xiamen (CN); Jin Wang, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 15/871,358

(22) Filed: Jan. 15, 2018

(65) Prior Publication Data
US 2018/0151762 A1 May 31, 2018

Related U.S. Application Data

(63) Continuation of application No. PCT/CN2017/087712, filed on Jun. 9, 2017.

(30) Foreign Application Priority Data

Jun. 12, 2016 (CN) .......................... 2016 1 0403930

(51) Int. Cl.
*H01L 33/00* (2010.01)
*H01L 31/0304* (2006.01)
(Continued)

(52) U.S. Cl.
CPC ...... *H01L 31/0304* (2013.01); *H01L 33/0079* (2013.01); *H01L 33/06* (2013.01);
(Continued)

(58) Field of Classification Search
CPC ..... H01L 33/0079; H01L 33/06; H01L 33/12; H01L 33/30; H01L 31/0304; H01L 31/0352; H01L 31/0327; H01L 31/03046
See application file for complete search history.

(56) References Cited

U.S. PATENT DOCUMENTS

| 7,492,801 | B2 * | 2/2009 | Kishimoto | ............. | B82Y 20/00 |
| | | | | | 372/43.01 |
| 2005/0152419 | A1 * | 7/2005 | Kishimoto | ............. | B82Y 20/00 |
| | | | | | 372/43.01 |

FOREIGN PATENT DOCUMENTS

| CN | 102822999 A | 12/2012 |
| CN | 105489719 A | 4/2016 |

OTHER PUBLICATIONS

Hu et al., "Ge-on-Si for Si-based integrated materials and photonic devices". 2012, Front. Optoelectron., vol. 5 (1) pp. 41-50, (Dec. 2012).*

(Continued)

*Primary Examiner* — Nikolay K Yushin
(74) *Attorney, Agent, or Firm* — Syncoda LLC; Feng Ma

(57) ABSTRACT

An infrared light-emitting diode includes, from up to bottom, a P-type ohmic electrode, a contact layer, a P-type cladding layer, an active layer, an N-type cladding layer, a buffer layer, a GaAs substrate and an N-type ohmic electrode. The N-type cladding layer and the P-type cladding layer or either of them is $In_xGa_{1-x}As$. The cladding layer of $In_xGa_{1-x}As$, due to low resistance, can improve current expansion, reduce voltage and improve light-emitting efficiency.

9 Claims, 2 Drawing Sheets

(51) Int. Cl.
  *H01L 33/06* (2010.01)
  *H01L 33/12* (2010.01)
  *H01L 33/30* (2010.01)
  H01L 31/0352 (2006.01)
  H01L 33/40 (2010.01)

(52) U.S. Cl.
  CPC .............. *H01L 33/12* (2013.01); *H01L 33/30* (2013.01); *H01L 31/0352* (2013.01); *H01L 33/405* (2013.01); *H01L 2933/0016* (2013.01)

(56) References Cited

OTHER PUBLICATIONS

Sze et al., "Physics of Semiconductor Devices", 2007, John Wiley and Sons, NJ, p. 610, Fig. 9, 12.3.1.; Dec 2007.*
Chang et al., "Theoretical and Experimental Analysis on InAlGaAs/AlGaAs Active Region of 850-nm Vertical-Cavity Surface-Emitting Lasers", 2006, Journal of Lightwave Technology, vol. 24, No. 1, pp. 538-543, Jan. 2006.*

* cited by examiner

INFRARED LIGHT EMITTING DIODE

CROSS-REFERENCE TO RELATED APPLICATIONS

The present application is a continuation of, and claims priority to, PCT/CN2017/087712 filed on Jun. 9, 2017, which claims priority to Chinese Patent Application No. 201610403930.0 filed on Jun. 12, 2016. The disclosures of these applications are hereby incorporated by reference in their entirety.

BACKGROUND

Infrared light-emitting diodes, with specific wave bands, low power consumption and high reliability, are widely applied in fields such as security monitoring, wearable devices, space communication, remote control, medical appliances, sensor light sources and night lighting.

In general, an infrared light-emitting diode with light-emitting peak wavelength above 900 nm is used, having an active layer of InGaAs and a cladding layer of AlGaAs with indirect energy gap.

SUMMARY

The inventors of the present disclosure have recognized that, as Al atom is highly active and easily oxidized, and the material is of high resistivity, this structure has poor current spreading and low antistatic resistance.

To solve the above problems, the present disclosure provides an infrared light-emitting diode with a low-band gap cladding layer, wherein, the cladding layer is GaAs or $In_xGa_{1-x}As$. Compared with AlGaAs material, GaAs or InGaAs has low resistivity and is free of easy-oxidized Al component, which can improve horizontal conduction of current and show good current spreading effect if applied in the cladding layer.

According to a first aspect of the present disclosure, the technical scheme to solve the above problems is provided: an infrared light-emitting diode includes a first cladding layer, an active layer and a second cladding layer, wherein, the first cladding layer is $In_xGa_{1-x}As$, where, In component is $0\% \leq x \leq 5\%$, and difference of lattice match between layers $\Delta a_0$ is <3,800 ppm.

In some embodiments, the first cladding layer is 1-20 μm thick.

In some embodiments, the second cladding layer is $In_yGa_{1-y}As$, wherein, In component is $0\% \leq y \leq 5\%$, and difference of lattice match between layers $\Delta a_0$ is <3,800 ppm.

According to a preferred embodiment, an infrared light-emitting diode, from up to bottom, includes: a P-type ohmic electrode, a contact layer, a P-type cladding layer, an active layer, an N-type cladding layer, a buffer layer, a GaAs substrate and an N-type ohmic electrode, wherein, the N-type cladding layer and the P-type cladding layer or either of them is $In_xGa_{1-x}As$. The advantage is that the cladding layer of $In_xGa_{1-x}As$, due to low resistance, can improve current expansion, reduce voltage and improve light-emitting efficiency.

According to another preferred embodiment of the present disclosure, an infrared light-emitting diode, from up to bottom, includes: an N-type ohmic electrode, an N-type contact layer, an N-type cladding layer, a quantum well active layer, a P-type cladding layer, a P-type contact layer, a metal bonding layer, a Si substrate and an N-type ohmic electrode, wherein, the N-type cladding layer and the P-type cladding layer or either of them is $In_xGa_{1-x}As$.

In some embodiments, the N-type cladding layer and the P-type cladding layer are 1-20 μm thick. Within this thickness range, the component has good antistatic resistance.

In some embodiments, when the P-type cladding layer and/or the N-type cladding layer is InGaAs, light-emitting peak wavelength of the active layer is above 930 nm, which is higher than the maximum light absorption wavelength of the InGaAs material, which is 910 nm.

In some embodiments, the active layer is a multi-quantum well structure, wherein, the well layer is $(In_xGa_{1-x})As$ or $(Al_{X1}Ga_{1-X1})_{Y1}In_{1-Y1}As$, which provides compressive strain when compared to that of the substrate. The thickness of the well layer is d1. Then, the barrier layer $(Al_{X1}Ga_{1-X1})As_{X2}P_{1-X2}$ or $(Al_{X1}Ga_{1-X1})_{Y2}In_{1-Y2}P$ applies strain opposite to that of the well layer. The thickness of the barrier layer is d2. By stacking two kinds of materials with different strains, a quantum well structure is formed. When d1 and d2 are controlled respectively, total strain can be coincided to achieve mutual matching of the quantum well lattice and the substrate GaAs. This effectively improves lattice dislocation and reduces dislocation defects, thus improving light-emitting efficiency of the structure.

According to a second aspect of the present disclosure, an infrared light-emitting system including a plurality of light-emitting diodes is provided. Each infrared light-emitting diode further includes a first cladding layer, an active layer, and a second cladding layer. The first cladding layer is $In_xGa_{1-x}As$, where, In component is $0\% \leq X \leq 5\%$, and a difference of lattice match between layers $\Delta a_0$ is <3,800 ppm.

In another aspect, a light-emitting system is provided including a plurality of the LEDs. The system can be used in the applications of night lighting, security, medical applications, communications, etc.

Various embodiments of the present disclosure can have one or more of the following advantageous effects: (I) GaAs and InGaAs materials have low energy gap and low resistivity, which can reduce serial resistance of the component. In addition, with low voltage value, GaAs and InGaAs materials can enhance horizontal spreading of current and improve light-emitting efficiency. (II) GaAs and InGaAs materials can block visible light from being emitted from the component, appearing no weak red light when the component is lighted on, thus eliminating red dot effect of infrared light-emitting diodes.

The other features and advantages of embodiments of the present disclosure will be described in detail in the following specification, and it is believed that such features and advantages will become more obvious in the specification or through implementations of this disclosure. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

Figure 1:
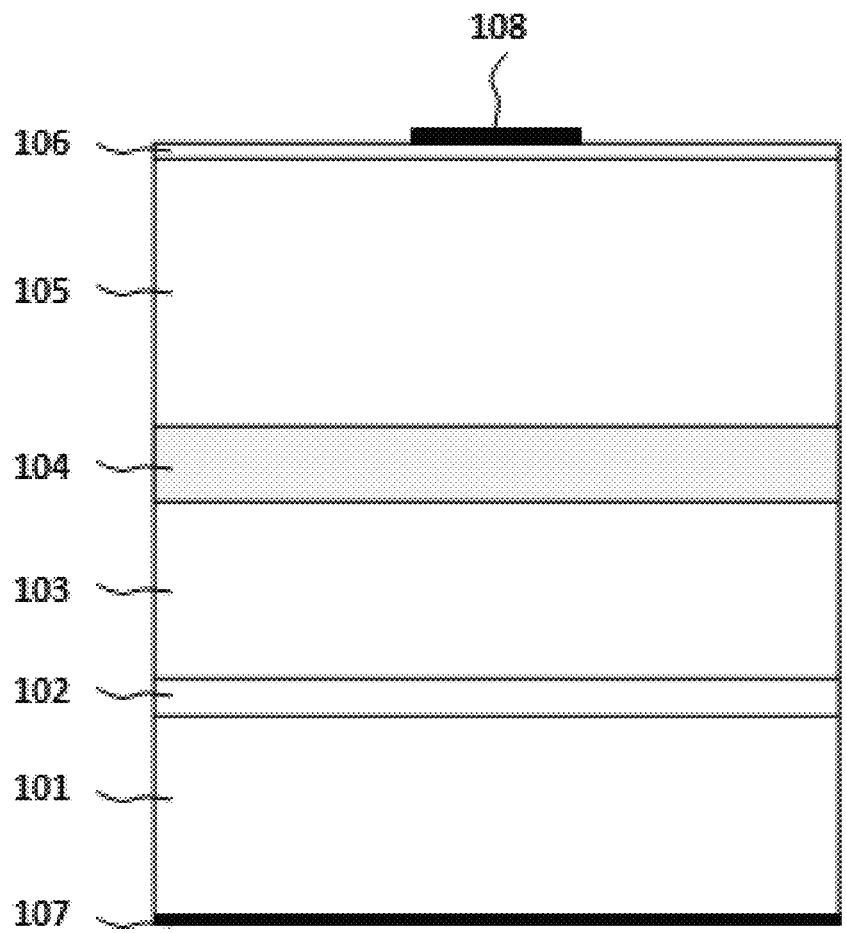
FIG. 1 illustrates a sectional view of an infrared light-emitting diode structure according to some embodiments of the present disclosure.

In the drawings: 101: GaAs substrate; 102: Buffer layer; 103: N-type cladding layer; 104: Quantum well active layer; 105: P-type cladding layer; 106: Contact layer; 107: N-type ohmic electrode; 108: P-type ohmic electrode; 201: Si substrate; 202: Metal bonding layer; 203: P-type contact layer; 204: P-type cladding layer; 205: Quantum well active layer; 206: N-type cladding layer; 207: N-type contact layer; 208: P-type ohmic electrode; 209: N-type ohmic electrode.

DETAILED DESCRIPTION

The embodiments of the present disclosure will be described in detail with reference to the accompanying drawings and examples, to help understand and practice the disclosed embodiments, regarding how to solve technical problems using technical approaches for achieving the technical effects. It should be understood that the embodiments and their characteristics described in this disclosure may be combined with each other and such technical proposals are deemed to be within the scope of this disclosure without departing from the spirit of this disclosure.

In the present disclosure, the first cladding layer and the second cladding layer are semiconductor layers of opposite types. For example, when the first cladding layer is an N-type semiconductor layer, the second cladding layer is a P-type semiconductor layer; if the first cladding layer is a P-type semiconductor layer, the second cladding layer is an N-type semiconductor layer.

Embodiment 1

As shown in FIG. 1, an infrared light-emitting diode chip with low-band gap cladding layer, from up to bottom, includes: a P-type ohmic electrode 108, a contact layer 106, a P-type cladding layer 105, a quantum well active layer 104, an N-type cladding layer 103, a buffer layer 102, a GaAs substrate 101 and an N-type ohmic electrode 107. In this embodiment, a multi-quantum well active layer is formed via organic metal vapor phase epitaxy (OMVPE) having a well layer of InGaAs and a barrier layer of AlGaAsP, wherein, light-emitting peak wavelength is above 900 nm, and number of quantum well pairs is 3-25.

Specifically, the GaAs substrate 101 is a Si-doped single crystal N-type GaAs substrate with concentration of 8E17-3E18 atoms/cm$^3$ and preferred concentration of 1.2E18 atoms/cm$^3$; the buffer layer 102 is GaAs with concentration of 8E17-5E18 atoms/cm$^3$ and preferred concentration of 1.5E18 atoms/cm$^3$; the N-type cladding layer is In$_x$Ga$_{1-x}$As, wherein, In component X is 0%-5%, and preferred X is 2%; concentration is 5E17-2E18 atoms/cm$^3$, and preferred concentration is 7E17 atoms/cm$^3$; and thickness is 1-20 μm; the active layer 104 is an active layer of non-doped multiple-quantum well structure, wherein, the well layer is AlInGaAs with thickness of 3-80 nm, and the barrier layer is AlGaAsP with thickness of 5-90 nm and preferred thickness of 24 nm; number of quantum well pairs is 3-25, and preferred number of pairs is 12; the P-type cladding layer 105 is C-doped In$_x$Ga$_{1-x}$As, wherein, In component X is 0%-5%, and preferred X is 2%; concentration is 8E17-6E18 atoms/cm, and preferred concentration is 1E18 atoms/cm$^3$; the P-type contact layer 106 is highly C-doped GaAs, wherein, concentration is higher than 5E18 atoms/cm$^3$, and preferred concentration is 8E18 atoms/cm$^3$.

In this embodiment, the active layer 104 is a multiple-quantum well structure, wherein, number of quantum well pairs is 12; the well layer is (In$_{0.15}$Ga$_{0.75}$)As with thickness of 8 nm, wherein, the material applies compression strain on the GaAs, and the barrier layer is (Al$_{0.1}$Ga$_{0.9}$)As$_{0.85}$P$_{0.15}$ with thickness of 24 nm, wherein, the material applies tensile strain on the GaAs. At this thickness, the total strain is coincided and consistent with the substrate, achieving lattice matching. Difference of lattice match between layers Δa$_0$ is <1,500 ppm, causing no mismatch defect.

In the above infrared light-emitting diode, when 20 mA forward current is input, the forward voltage is 1.27 V, light-emitting wavelength is 956 nm and light-emitting output power is 4.9 mW. The cladding layer of In$_x$Ga$_{1-x}$As, with maximum light absorption wavelength of 910 nm, can block invisible light, appearing no weak red light when the component is lighted on.

Embodiment 2

Figure 2:
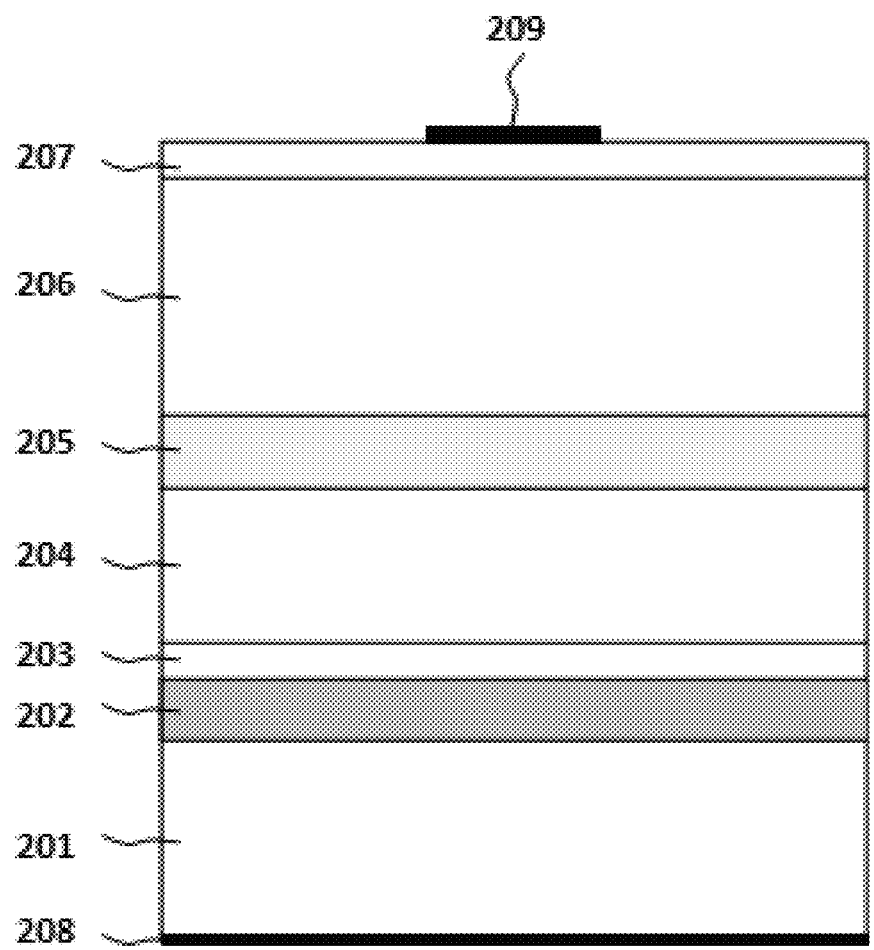
FIG. 2 illustrates a sectional view of another infrared light-emitting diode structure according to some embodiments of the present disclosure.

As shown in FIG. 2, an infrared light-emitting diode chip with a low-band gap cladding layer, from up to bottom, includes: an N-type ohmic electrode 209, an N-type contact layer 207, an N-type cladding layer 206, an active layer 205, a P-type cladding layer 204, a P-type contact layer 203, a metal bonding layer 202, a Si substrate 201 and a P-type ohmic electrode 208. In this embodiment, a Si substrate is used, and the metal bonding layer reflects the light emitted downward from the active layer, which effectively improves light extraction and light-emitting efficiency.

Specifically, the N-type cladding layer 206 and the P-type cladding layer 204 are In$_x$Ga$_{1-x}$As, wherein, In component X is 0%-5%, and preferred X is 2%; and concentration is 5E17-2E18 atoms/cm$^3$, and preferred concentration is 7E17 atoms/cm$^3$. The active layer 205 is a multi-quantum well layer, including alternative well layers and barrier layers, wherein, number of quantum well pairs is 12; the well layer is (In$_{0.15}$Ga$_{0.85}$)As with thickness of 8 nm, and the material applies compressive strain on the growth substrate GaAs; the barrier layer is (Al$_{0.05}$Ga$_{0.95}$)$_{0.65}$In$_{0.35}$P, with thickness of 20 nm, and the material applies tensile strain on the growth substrate GaAs. At this thickness, the total strain is coincided and consistent with the substrate, achieving lattice matching. In addition, the Al component X of the cladding layer is controlled between 0%-5%, thus guaranteeing that difference of lattice match between layers Δa$_0$ is <1,500 ppm, causing no mismatch defect.

In the above infrared light-emitting diode, when 50 mA forward current is input, the forward voltage is 1.42 V, light-emitting wavelength is 950 nm and light-emitting output power is 16.5 mW. The cladding layer of InGaAs, with maximum light absorption wavelength of 910 nm, can block invisible light, appearing no weak red light when the component is lighted on.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An infrared light-emitting diode, comprising: a first cladding layer; an active layer; and a second cladding layer; wherein: the first cladding layer is $In_xGa_{1-x}As$, where, In component is $0 \leq X \leq 5\%$, and a difference of lattice match between layers $\Delta a_0$ is <3,800 ppm, and the light-emitting peak wavelength of the active layer is above 930 nm.

2. The infrared light-emitting diode of claim 1, wherein, the first cladding layer and the second cladding layer is 1-20 µm thick.

3. The infrared light-emitting diode of claim 1, wherein, In component of the first cladding layer of $In_xGa_{1-x}As$ is 2%.

4. The infrared light-emitting diode of claim 1, wherein, the second cladding layer is $In_yGa_{1-y}As$, wherein, In component is $0\% < y < 5\%$, and difference of lattice match between layers $\Delta a_0$ is <3,800 ppm.

5. The infrared light-emitting diode of claim 4, wherein, In component of the second cladding layer of $In_yGa_{1-y}As$ is 2%.

6. The infrared light-emitting diode of claim 1, from up to bottom, comprises:
a first ohmic electrode;
a contact layer;
a first cladding layer;
an active layer;
a second cladding layer;
a buffer layer;
a GaAs substrate; and
a second-type ohmic electrode.

7. An infrared light-emitting diode, comprising:
a first cladding layer;
an active layer; and
a second cladding layer;
wherein:
the first cladding layer is $In_xGa_{1-x}As$, where, In component is $0\% \leq X \leq 5\%$, and a difference of lattice match between layers $\Delta a_0$ is <3,800 ppm;
the active layer is a multiple-quantum well structure, wherein, well layers and barrier layers have strains with opposite directions, and total strain is coincided.

8. The infrared light-emitting diode of claim 7, wherein, difference of lattice match between layers $\Delta a_0$ is <1,500 ppm.

9. An infrared light-emitting diode, comprising:
a first cladding layer;
an active layer; and
a second cladding layer;
wherein:
the first cladding layer is $In_xGa_{1-x}As$, where, In component is $0\% \leq X \leq 5\%$, and a difference of lattice match between layers $\Delta a_0$ is <3,800 ppm; and from up to bottom, the infrared light-emitting diode further comprises:
a second type ohmic electrode;
a contact layer;
a second cladding layer;
an active layer;
a second type cladding layer;
a contact layer;
a metal bonding layer;
a Si substrate; and
a first-type ohmic electrode.

* * * * *